(12) United States Patent  
Kim et al.

(10) Patent No.: US 8,772,146 B2  
(45) Date of Patent: Jul. 8, 2014

(54) SEMICONDUCTOR DEVICE AND METHOD FOR FABRICATING THE SAME

(75) Inventors: Ju-Youn Kim, Suwon-si (KR); Hyun-Min Choi, Anyang-si (KR); Sung-Kee Han, Seoul (KR); Je-Don Kim, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 13/596,619

(22) Filed: Aug. 28, 2012

(65) Prior Publication Data

US 2014/0065809 A1  Mar. 6, 2014

(51) Int. Cl.  
*H01L 21/28* (2006.01)

(52) U.S. Cl.  
USPC .......... 438/586; 438/585; 438/765; 438/382; 438/183; 257/686

(58) Field of Classification Search  
USPC .......................................... 438/586; 257/686  
See application file for complete search history.

(56) References Cited

U.S. PATENT DOCUMENTS

| 6,445,047 | B1 | 9/2002 | Yamada et al. |
| 6,514,827 | B2 | 2/2003 | Kim et al. |
| 2013/0034946 | A1* | 2/2013 | Chuang et al. ............... 438/382 |
| 2013/0113106 | A1* | 5/2013 | Nguyen ....................... 257/753 |

FOREIGN PATENT DOCUMENTS

KR  1020020051408  6/2002

* cited by examiner

*Primary Examiner* — Mamadou Diallo  
(74) *Attorney, Agent, or Firm* — F. Chau & Associates, LLC

(57) ABSTRACT

A method of fabricating a semiconductor device includes forming a first gate pattern and a dummy gate pattern on a first active area and a second active area of a substrate, respectively, the first gate pattern including a first gate insulating layer and a silicon gate electrode, removing the dummy gate pattern to expose a surface of the substrate in the second active area, forming a second gate pattern including a second gate insulating layer and a metal gate electrode on the exposed surface of the substrate, the first gate insulating layer having a thickness larger than a thickness of the second gate insulating layer, and forming a gate silicide on the silicon gate electrode after forming the second gate pattern.

9 Claims, 15 Drawing Sheets

SEMICONDUCTOR DEVICE AND METHOD FOR FABRICATING THE SAME

BACKGROUND

1. Technical Field

The present disclosure relates to a semiconductor device and method for fabricating the same.

2. Description of the Related Art

Recently, down-scaling of a semiconductor device is being advanced rapidly along with the development of electronic technology. The semiconductor device may include, for example, both a portion requiring a relatively fast reaction and a portion requiring a relatively stable operation. With the down-scaling of the semiconductor device, various studies are being conducted on how to optimize transistors included in portions having different functions.

SUMMARY

Exemplary embodiments of the present invention provide a semiconductor device with increased reliability by using a silicon electrode in a portion requiring stability and using a metal electrode in a portion requiring a fast operating speed.

Exemplary embodiments of the present invention also provides a method for fabricating the semiconductor device.

According to an exemplary embodiment of the present invention, there is provided a method for fabricating the semiconductor device comprising forming a first gate pattern and a dummy gate pattern on a first active area and a second active area of a substrate, respectively, the first gate pattern including a first gate insulating layer and a silicon gate electrode, removing the dummy gate pattern to expose a surface of the substrate in the second active area, forming a second gate pattern including a second gate insulating layer and a metal gate electrode on the exposed surface of the substrate, the first gate insulating layer having a thickness larger than a thickness of the second gate insulating layer, and forming a gate silicide on the silicon gate electrode after forming the second gate pattern.

According to an exemplary embodiment of the present invention, there is provided a method for fabricating the semiconductor device comprising forming a first gate pattern and a dummy gate pattern on a first active area and a second active area of a substrate, respectively, the first gate pattern including a first gate insulating layer and a silicon gate electrode, forming a gate silicide on the silicon gate electrode, removing the dummy gate pattern after forming the gate silicide to expose a surface of the substrate in the second active area, and forming a second gate pattern including a second gate insulating layer and a metal gate electrode on the exposed surface of the substrate, the second gate insulating layer having a thickness smaller than a thickness of the first gate insulating layer.

According to an exemplary embodiment of the present invention, a method for fabricating a semiconductor device is provided. The method includes sequentially forming an insulating layer and a silicon layer on a substrate, wherein the substrate includes at least one element isolation region, a first active area and a second active area defined in the substrate by the at least one element isolation region, forming a mask pattern including a plurality of openings on the silicon layer, wherein the openings are formed on the first active area and the second active area, respectively, patterning the insulating layer and the silicon layer by etching using the mask pattern as an etching mask to form a first gate pattern and a dummy gate pattern on the first active area and the second active area of the substrate, respectively, wherein the first gate pattern includes a first gate insulating layer and a first silicon gate electrode disposed on the first gate insulating layer.

In addition, the method further includes forming a spacer on a side surface of the first gate pattern and the dummy gate pattern, forming a buried insulating layer to surround the first gate pattern and the dummy gate pattern and expose an upper surface of the first gate pattern and an upper surface of the dummy gate pattern, forming a gate silicide on the first silicon gate electrode, removing the dummy gate pattern to form a trench in the buried insulating layer to expose a surface of the substrate in the second active area, forming a second gate pattern including a second gate insulating layer and a metal gate electrode sequentially stacked on the exposed surface of the substrate in the trench in the second active area, wherein the second gate insulating layer includes a chemical silicon oxide layer and a high-k gate insulating layer disposed on the chemical silicon oxide layer, and wherein the second gate insulating layer has a thickness smaller than a thickness of the first gate insulating layer and forming a third gate pattern including a third gate insulating layer and a second silicon gate electrode sequentially stacked on the at least one element isolation region of the substrate.

BRIEF DESCRIPTION OF THE DRAWINGS

Exemplary embodiments of the present invention can be understood in more detail from the following detailed description when taken in conjunction with the attached drawings, in which.

DETAILED DESCRIPTION OF EXEMPLARY EMBODIMENTS

Exemplary embodiments of the present invention will now be described more fully hereinafter with reference to the accompanying drawings, in which exemplary embodiments of the invention are shown. Exemplary embodiments of the invention may, however, be embodied in different forms and should not be construed as limited to exemplary embodiments set forth herein. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present.

The use of the terms "a" and "an" and "the" and similar referents in the context of describing the invention (especially in the context of the following claims) are to be construed to cover both the singular and the plural, unless otherwise indicated herein or clearly contradicted by context.

Hereinafter, a semiconductor device in accordance with an exemplary embodiment of the present invention will be described with reference to FIG. 1.

Figure 1:
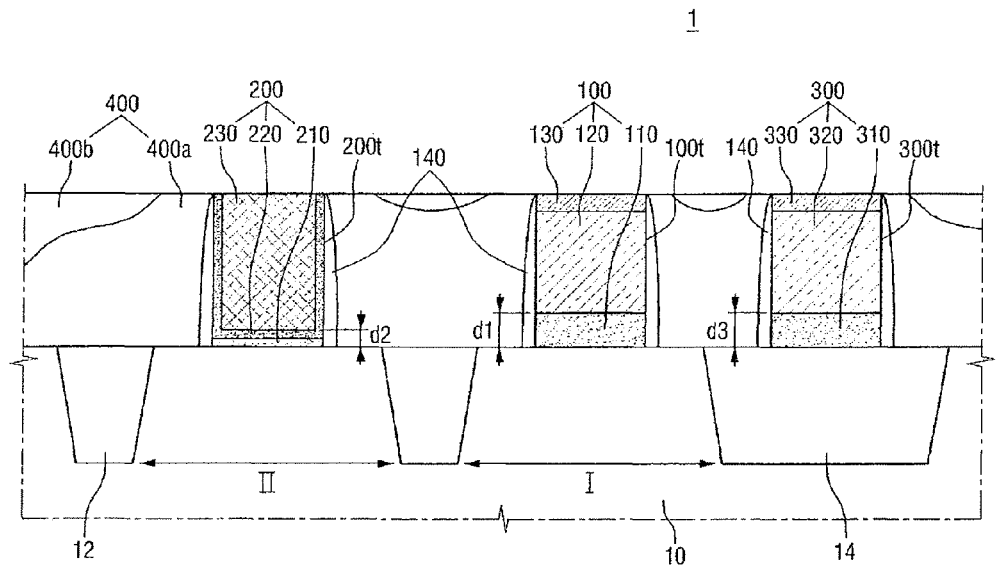
FIG. 1 is a cross-sectional view showing a semiconductor device in accordance with an exemplary embodiment of the present invention.

FIG. 1 is a cross-sectional view showing a semiconductor device in accordance with an exemplary embodiment of the present invention.

First, referring to FIG. 1, a semiconductor device 1 includes, for example, a substrate 10, a first gate pattern 100 and a second gate pattern 200. The semiconductor device 1 may further include, for example, a third gate pattern 300. Further, although not shown in FIG. 1, a silicide pattern may be formed, for example, at both sides of each of the first gate pattern 100 and the second gate pattern 200, and source and/or drain contacts may be formed on, for example, the silicide pattern.

Referring to FIG. 1, the semiconductor device 1 includes, for example, a first element isolation region 12 and a second element isolation region 14 isolating active areas on the substrate 10. The first element isolation region 12 and the second element isolation region 14 have different widths from each other. The substrate 10 includes, for example, a first active area I and a second active area II defined by the first and second element isolation regions 12 and 14. The semiconductor device 1 includes, for example, the first gate pattern 100 formed on the first active area I and the second gate pattern 200 formed on the second active area II. The semiconductor device 1 may further include, for example, a third gate pattern 300 disposed on the second element isolation region 14 whose upper surface has a width larger than that of the first element isolation region 12. The first gate pattern 100 includes, for example, a first gate insulating layer 110, a first silicon gate electrode 120 and a first gate silicide 130, which are sequentially formed on the first active area I. The second gate pattern 200 includes, for example, a second gate insulating layer 210 and 220 and a metal gate electrode 230, which are sequentially formed on the second active area II. The second gate insulating layer 210 and 220 has, for example, a thickness d2 smaller than a thickness d1 of the first gate insulating layer 110. Here, the "thickness" is a distance from an upper surface 10s of the substrate to each of the first silicon gate electrode 120 and the metal gate electrode 230. The third gate pattern 300 may include, for example, a third gate insulating layer 310, a second silicon gate electrode 320 and a second gate silicide 330, which are sequentially formed on the second element isolation region 14. The third gate insulating layer 310 may have, for example, a thickness d3 which is equal to, e.g., the thickness d1 of the first gate insulating layer 110.

Further, for example, although not shown in FIG. 1, if an upper portion of the substrate 10 contains, e.g., silicon, a silicide pattern may be formed on the first and second active areas I and II not overlapping with the first gate pattern 100 and the second gate pattern 200.

Referring to FIG. 1, the semiconductor device 1 may further include, for example, a buried insulating layer 400 formed on the substrate 10. The buried insulating layer 400 may include, for example, a first trench 100t, a second trench 200t and a third trench 300t. For example, the first trench 100t may be formed on the first active area I, the second trench 200t may be formed on the second active area II, and the third trench 300t may be formed on the second element isolation region 14. The side surfaces of the first to third trenches 100t, 200t and 300t may be formed of spacers 140, but exemplary embodiments of the present invention are not limited thereto. The first gate pattern 100 may be formed in the first trench 100t, the second gate pattern 200 may be formed in the second trench 200t, and the third gate pattern 300 may be formed in the third trench 300t.

For example, the substrate 10 may be made of bulk silicon or silicon-on-insulator (SOI). Alternatively, the substrate 10 may be a silicon substrate, or include other materials such as silicon germanium, indium antimonide, lead telluride, indium arsenide, indium phosphide, gallium arsenide, or gallium antimonide, but exemplary embodiments of the present invention are not limited thereto. Each of the first and second element isolation regions 12 and 14 includes, for example, a recess and an insulating pattern including, e.g., an oxide layer filling up the recess. The first and second element isolation regions 12 and 14 may be formed to have, for example, a shallow trench isolation (STI) structure, which may be beneficial to high integration due to, e.g., excellent element isolation characteristics and small occupation area. The widths of the first and second element isolation regions 12 and 14 may vary according to functions. For example, the width of the second element isolation region 14 for forming the gate pattern on the element isolation region may be larger than the width of the first element isolation region 12 for the isolation characteristics of the element to be formed on the active area.

The buried insulating layer 400 may include, for example, a first buried insulating layer 400a and a second buried insulating layer 400b. The first buried insulating layer 400a formed on the substrate 10 may include, e.g., undoped silicate glass (USG), silicon oxide ($SiO_2$) or the like. The second buried insulating layer 400b formed on the first buried insulating layer 400a may be, e.g., a stress liner, and specifically, may include silicon nitride (SiN). The spacers 140 which may constitute the side surfaces of the first to third trenches 100t, 200t and 300t may include at least one layer. The spacers 140 may include, e.g., a nitride layer or oxide layer. The spacers 140 may be formed on sidewalls of the first to third gate patterns 100, 200 and 300.

Referring to FIG. 1, the first gate pattern 100 formed in the first trench 100t may include, for example, the first gate insulating layer 110, the first silicon gate electrode 120 and the first gate silicide 130 formed on the substrate 10. The first gate insulating layer 110 and the first silicon gate electrode 120 that are sequentially stacked are formed, for example, parallel to each other on the upper surface 10s of the substrate. In other words, an interface between the substrate 10 and the first gate insulating layer 110 is parallel to an interface between the first gate insulating layer 110 and the first silicon gate electrode 120. Here, "being parallel to each other" may include not only a case where there is the same distance between two surfaces to be compared, but also a case where there is a relatively small difference in distance between two surfaces to be compared due to a margin in processing or the like.

To describe in terms of a fabricating method of the first gate pattern 100, the first gate insulating layer 110 and the first silicon gate electrode 120 may, for example, mean portions formed before forming the buried insulating layer 400. The first gate pattern 100 may be, e.g., a high-voltage transistor formed in a peripheral region of the semiconductor device, but exemplary embodiments of the present invention are not limited thereto. That is, the first gate pattern 100 may mainly function as a transistor having reliability despite a relatively slow operating speed rather than a transistor having a relatively fast operating speed.

The first gate insulating layer 110 may include, e.g., one of a silicon oxide ($SiO_2$) layer, a silicon oxynitride (SiON) layer and a combination thereof. A region close to the substrate 10 in the silicon oxide layer included in the first gate insulating layer 110 may be formed by, e.g., thermal oxidation, but exemplary embodiments of the present invention are not limited thereto. The first silicon gate electrode 120 may be made of, e.g., polycrystalline silicon or amorphous silicon, but exemplary embodiments of the present invention are not limited thereto. To reduce the resistance of the first silicon gate electrode 120, the first silicon gate electrode 120 may include, e.g., impurities. For example, the impurities included in the first silicon gate electrode 120 may vary according to whether the transistor is a p-type MOS or n-type MOS transistor. For example, the concentration of impurities may be changed to adjust the operating characteristics. The first gate silicide 130 may include, e.g., any one of nickel (Ni), platinum (Pt), titanium (Ti), ruthenium (Ru), rhodium (Rh), cobalt (Co), hafnium (Hf), tantalum (Ta), erbium (Er), ytterbium (Yb), tungsten (W), or a combination thereof. The first gate silicide 130 may be formed in, e.g., the first trench 100t.

Referring to FIG. 1, the second gate pattern 200 formed in the second trench 200t may include, for example, the second gate insulating layer 210 and 220 and the metal gate electrode 230 formed on the substrate 10. In the semiconductor device of the present exemplary embodiment of the present invention, the second gate insulating layer 210 and 220 may be formed, for example, conformally along the bottom surface and both side surfaces of the second trench 200t. In addition, it is noted that the second gate insulating layer 210 and 220 may be formed, for example, parallel to the upper surface 10s of the substrate in accordance with the fabricating method. In the second gate insulating layer 210 and 220 conformally formed in the second trench 200t, the thickness of the second gate insulating layer 210 and 220 formed on the bottom surface of the second trench 200t may be, for example, different from the thickness of the second gate insulating layer 210 and 220 formed on both side surfaces of the second trench 200t. The metal gate electrode 230 formed on the second gate insulating layer 210 and 220 may be formed of a single layer, but exemplary embodiments of the present invention are not limited thereto. Alternatively, the metal gate electrode 230 may be formed of, e.g., a plurality of layers. The metal gate electrode 230 formed of a plurality of layers may include, e.g., a metal layer conformally formed on the second gate insulating layer 210 and 220 and both side surfaces of the second trench 200t, or a metal layer conformally formed on the second gate insulating layer 210 and 220.

To describe in terms of a fabricating method of the second gate pattern 200, the second gate insulating layer 210 and 220 and the metal gate electrode 230 may be formed, e.g., after forming the buried insulating layer 400. Not to mention that, for example, only the metal gate electrode 230 may be formed after forming the buried insulating layer 400. The second gate pattern 200 may be, e.g., a low-voltage transistor formed in a main region of the semiconductor device, but exemplary embodiments of the present invention are not limited thereto. That is, the second gate pattern 200 may mainly function as a transistor having a relatively fast operating speed rather than a transistor having reliability.

The second gate insulating layer 210 and 220 may include, e.g., a chemical silicon oxide layer 210 and a high dielectric constant (high-k) gate insulating layer 220. The high-k gate insulating layer 220 may include, e.g., at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The metal gate electrode 230 may be formed of a single layer or multiple layers including, e.g., hafnium (Hf), zirconium (Zr), titanium (Ti), tantalum (Ta), aluminum (Al) and/or an alloy thereof. For example, the metal gate electrode 230 may have a structure of five layers of titanium nitride (TiN)-tantalum nitride (TaN)-titanium aluminum (TiAl)-titanium nitride (TiN)-titanium (Ti)/aluminum (Al).

Referring to FIG. 1, the third gate pattern 300 formed in the third trench 300t may have the same structure as, e.g., the first gate pattern 100. In other words, the third gate insulating layer 310 and the second silicon gate electrode 320 that are sequentially stacked may be formed parallel to each other on the upper surface of the second element isolation region 14. In the same way as the first gate pattern 100, the third gate pattern 300 may be formed, e.g., before forming the buried insulating layer 400. The third gate pattern 300 formed on the second element isolation region 14 may be, e.g., a resistor or e-fuse, but exemplary embodiments of the present invention are not limited thereto. The third gate insulating layer 310, the second silicon gate electrode 320 and the second gate silicide 330 may be made of, e.g., the same materials as those of the first gate insulating layer 110, the first silicon gate electrode 120 and the first gate silicide 130, respectively. However, the impurities included in the second silicon gate electrode 320 may be, for example, different from the impurities included in the first silicon gate electrode 120 and may include, e.g., p-type impurities.

A metal-oxide-semiconductor (MOS) transistor using a silicon gate electrode is widely known. As various process parameters for fabricating a transistor using silicon as a gate electrode have been established, processing reliability may be ensured. However, as a silicon material usually has a resistance higher than that of a metal material, the silicon gate electrode operates at a speed lower than the gate made of a metal material. Meanwhile, the gate made of a metal material operates at a relatively fast speed, but may have processing reliability lower than the silicon gate electrode because less process parameters are established than the gate using the silicon gate electrode. The semiconductor device 1 according to the present exemplary embodiment of the present invention making up for this drawback may have benefits in terms of various aspects. For example, first, as residues of a photosensitive film or the like can be prevented from entering between the gate electrode and the gate insulating layer in, e.g., a high-voltage transistor requiring a stable operation, it is possible to ensure the reliability of the semiconductor device. Further, by using a well-established silicon gate electrode process, various electrical design parameters such as a resistor of the gate electrode may be used as they are. Accordingly, a transistor requiring a stable operation can be implemented directly without a change in design.

A method for fabricating a semiconductor device in accordance with an exemplary embodiment of the present invention will be described with reference to FIGS. 2 to 10. As the third gate pattern 300 shown in FIG. 1 is fabricated by the same fabricating method as the first gate pattern 100, a description of the fabricating method of the third gate pattern 300 will be omitted.

FIGS. 2 to 10 illustrate intermediate steps for explaining a method for fabricating a semiconductor device in accordance with an exemplary embodiment of the present invention.

Figure 2:
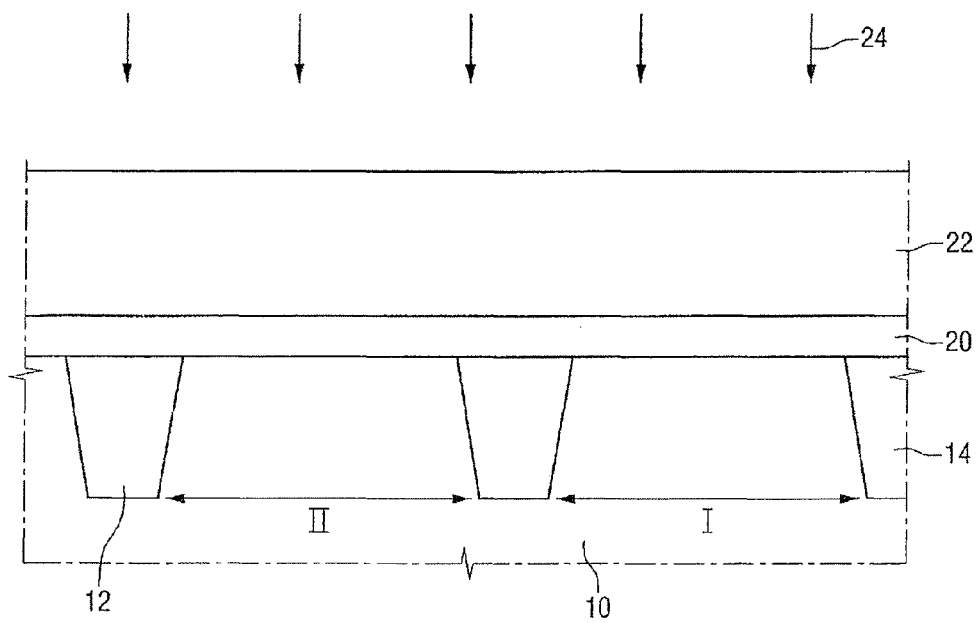
FIGS. 2 to 10 illustrate intermediate steps for explaining a method for fabricating a semiconductor device in accordance with an exemplary embodiment of the present invention.

Referring to FIG. 2, the first and second element isolation regions 12 and 14 defining the first active area I and the second active area II are formed on the substrate 10. An insulating layer 20 and a silicon layer 22 are sequentially formed on the substrate 10 on which the first and second element isolation regions 12 and 14 are formed. The substrate 10 may be made of, for example, bulk silicon or silicon-on-insulator (SOI). Alternatively, the substrate 10 may be, for example, a silicon substrate, or include other materials such as silicon germanium, indium antimonide, lead telluride, indium arsenide, indium phosphide, gallium arsenide, or gallium antimonide, but exemplary embodiments of the present invention are not limited thereto. In the method for fabricating the semiconductor device according to the present invention, a case where the substrate 10 is a silicon substrate will be described as an example. The first and second element isolation regions 12 and 14 may be an insulating pattern including, e.g., silicon oxide. The widths of the first and second element isolation regions 12 and 14 may vary according to purposes. Although a case where the upper surfaces of the first and second element isolation regions 12 and 14 and the upper surface of the substrate 10 are located on the same plane has been illustrated in FIG. 2, exemplary embodiments of the present invention are not limited thereto.

The insulating layer 20 may include, e.g., one of a silicon oxide ($SiO_2$) layer, a silicon oxynitride (SiON) layer and a combination thereof. The insulating layer 20 may be formed by, e.g., thermal treatment, chemical material treatment, atomic layer deposition (ALD), chemical vapor deposition (CVD) or the like.

The silicon layer 22 may include, e.g., one of polycrystalline silicon (poly Si), amorphous silicon (a-Si) and a combination thereof. The polycrystalline silicon may be formed by, e.g., CVD and the amorphous silicon may be formed by using, e.g., sputtering, CVD, plasma deposition or the like, but exemplary embodiments of the present invention are not limited thereto. The silicon layer 22 may include, e.g., impurities. The impurities included in the silicon layer 22 may be, for example, p-type impurities or n-type impurities according to, e.g., the type of transistor. The silicon layer 22 may be formed to include impurities, e.g., by ion implantation 24 after forming the silicon layer 22. Alternatively, the silicon layer 22 may be formed to include impurities, e.g., by doping impurities in-situ while forming the silicon layer 22, but exemplary embodiments of the present invention are not limited thereto.

After forming the silicon layer 22, a photosensitive film pattern (not shown) including a plurality of openings is formed on the silicon layer 22 (see FIG. 2). The openings included in the photosensitive film pattern are formed on the first active area I and the second active area II respectively. The photosensitive film pattern is removed after etching the insulating layer 20 and the silicon layer 22 by using, for example, the photosensitive film pattern formed on the silicon layer 22. In other words, the insulating layer 20 and the silicon layer 22 are patterned.

Figure 3:
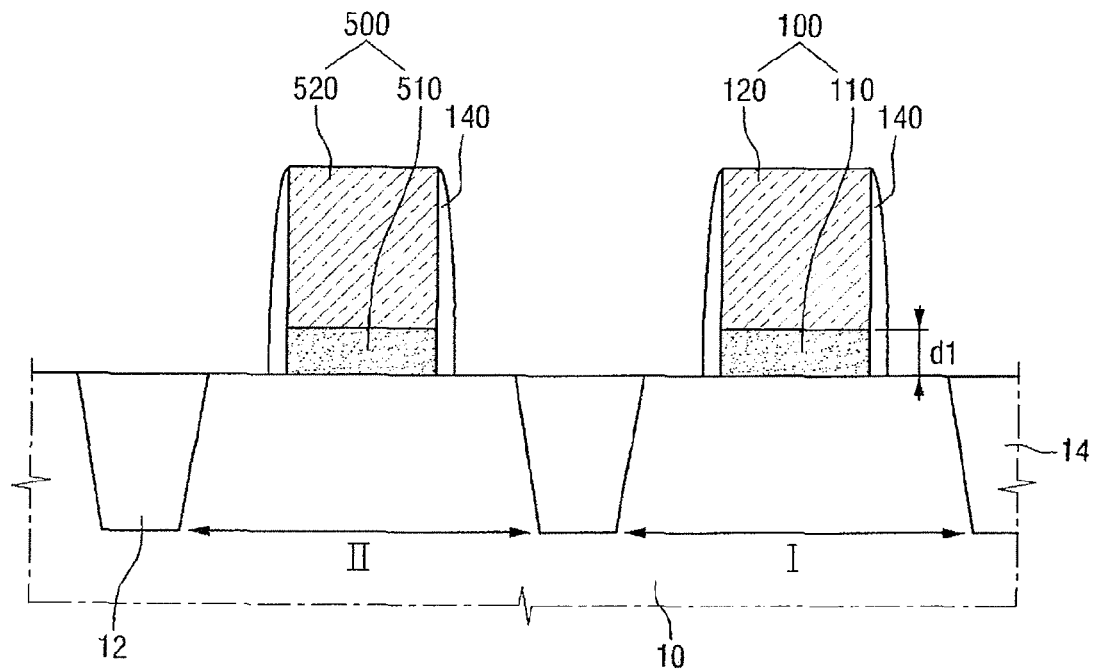

Referring to FIG. 3, the patterned insulating layer and silicon layer become the first gate pattern 100 and a dummy gate pattern 500 respectively. That is, the first gate pattern 100 is formed on the first active area I and the dummy gate pattern 500 is formed on the second active area II. The first gate pattern 100 and the dummy gate pattern 500 have, for example, the same structure, but the dummy gate pattern 500 is removed in the subsequent step. For example, the spacers 140 may be formed on the side surfaces of the first gate pattern 100 and the dummy gate pattern 500. The spacers 140 may include, e.g., silicon oxide, silicon nitride or the like. The spacers 140 may be formed on the side surfaces of the first gate pattern 100 and the dummy gate pattern 500 by forming a spacer film (not shown) using, e.g., a CVD process and then performing etch-back on the spacer film.

The first gate pattern 100 includes, for example, the first gate insulating layer 110 and the first silicon gate electrode 120. In the same way as the insulating layer 20 of FIG. 2, the first gate insulating layer 110 may include, e.g., one of a silicon oxide ($SiO_2$) layer, a silicon oxynitride (SiON) layer and a combination thereof. Further, the first gate insulating layer 110 may have the thickness d1. In the same way as the silicon layer 22 of FIG. 2, the first silicon gate electrode 120 may be made of, e.g., polycrystalline silicon or amorphous silicon, but exemplary embodiments of the present invention are not limited thereto. If the silicon layer 22 includes impurities, the first silicon gate electrode 120 may also includes impurities.

Figure 4:
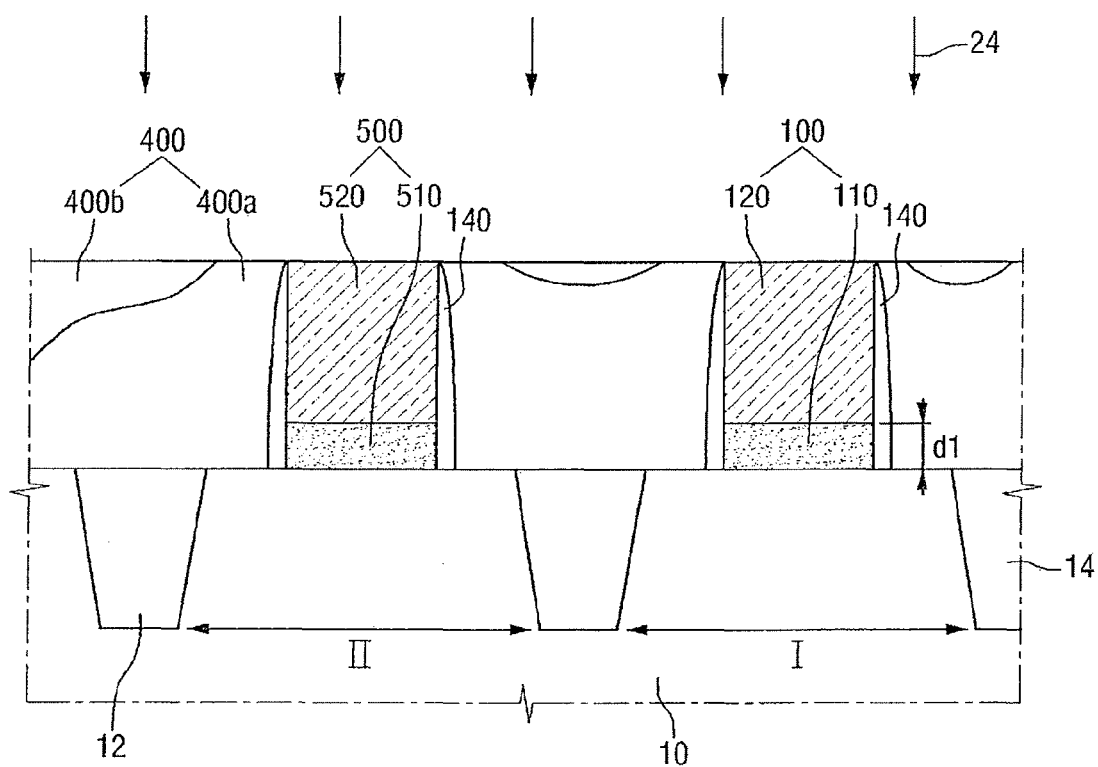

For example, referring to FIG. 4, the buried insulating layer 400 is formed to surround the first gate insulating layer 110 and the dummy gate pattern 500. The buried insulating layer 400 exposes the first gate pattern 100 and the dummy gate pattern 500. For example, the buried insulating layer 400 is formed on the first gate pattern 100 and the dummy gate pattern 500. The height of the buried insulating layer 400 is, for example, at least higher than those of the first gate pattern 100 and the dummy gate pattern 500. Then, the upper surface of the first gate pattern 100 and the upper surface of the dummy gate pattern 500 are exposed by, for example, partially removing the buried insulating layer 400. The method of partially removing the buried insulating layer 400 includes, for example, planarizing the buried insulating layer 400 until silicon of the first gate pattern 100 and the dummy gate pattern 500 is exposed by, e.g., chemical mechanical polishing (CMP).

If the silicon layer 22 does not include impurities in FIG. 2, the impurities may be, for example, implanted into the planarized buried insulating layer 400, the first gate pattern 100 and the dummy gate pattern 500 by, e.g., the ion implantation 24. That is, the resistance of the first silicon gate electrode 120 can be reduced by implanting impurities into the first silicon gate electrode 120 through ion implantation. The impurities included in the first silicon gate electrode 120 may be p-type impurities or n-type impurities according to, e.g., the type of transistor.

The buried insulating layer 400 may include, for example, the first buried insulating layer 400a and the second buried insulating layer 400b. The first buried insulating layer 400a may include, e.g., undoped silicate glass (USG), silicon oxide ($SiO_2$) or the like. The second buried insulating layer 400b may be, e.g., a stress liner, and may include, for example, silicon nitride (SiN).

Figure 5:
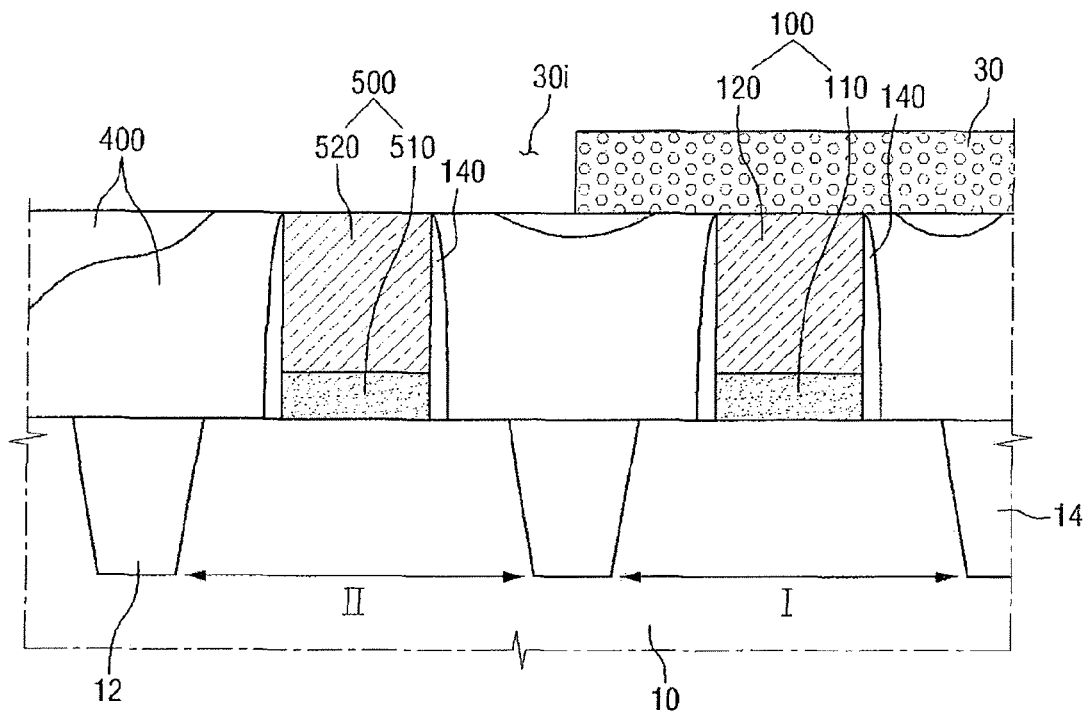

Referring to FIG. 5, a photosensitive film pattern 30 is formed on the buried insulating layer 400. The photosensitive film pattern 30 includes, for example, an opening 30*i* and the opening 30*i* is formed on the exposed dummy gate pattern 500. For example, the photosensitive film pattern 30 may protect the first active area I and expose the second active area II. The opening 30*i* may expose, for example, a portion of the upper surface of the buried insulating layer 400 and the upper surface of the dummy gate pattern 500. The first silicon gate electrode 120 included in the first gate pattern 100 is protected by the photosensitive film pattern 30. The photosensitive film pattern 30 may be, e.g., a mask pattern to be used in the subsequent etching step.

Figure 6:
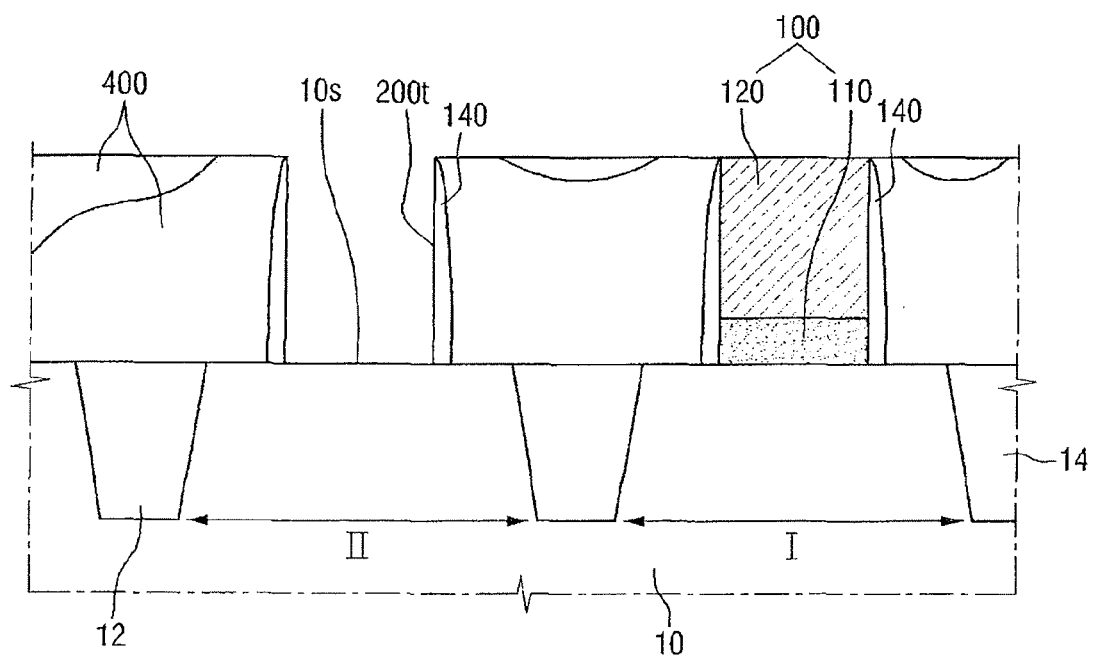

Referring to FIG. 6, the dummy gate pattern 500 is removed by, for example, using the photosensitive film pattern 30 (see FIG. 5) as an etching mask to form the second trench 200*t* in the buried insulating layer 400. When the second trench 200*t* is formed in the buried insulating layer 400, the surface 10*s* of the substrate 10 of the second active area II may be exposed. In the method of fabricating a semiconductor device according to the present exemplary embodiment of the present invention, a case where the surface 10*s* of the substrate is exposed by the second trench 200*t* will be described, but exemplary embodiments of the present invention are not limited thereto. After exposing the surface 10*s* of the substrate 10 of the second active area II, the photosensitive film pattern 30 used as an etch mask is removed.

A dummy silicon electrode 520 (see FIG. 5) included in the dummy gate pattern 500 exposed by the opening 30*i* is removed by, for example, an etching process. As an etching process for removing the dummy silicon electrode 520, a wet etching process using, e.g., ammonia, tetramethyl ammonium hydroxide (TMAH) and/or tetraethylammonium hydroxide (TEAH) may be used, but exemplary embodiments of the present invention are not limited thereto. A dummy gate insulating layer 510 (see FIG. 5) exposed after removing the dummy silicon electrode 520 is also removed through, for example, an etching process. The dummy gate insulating layer 510 may be removed by, for example, wet etching, dry etching and a combination thereof. The etching solution or etching gas may be changed according to the material of the dummy gate insulating layer 510.

Figure 7:
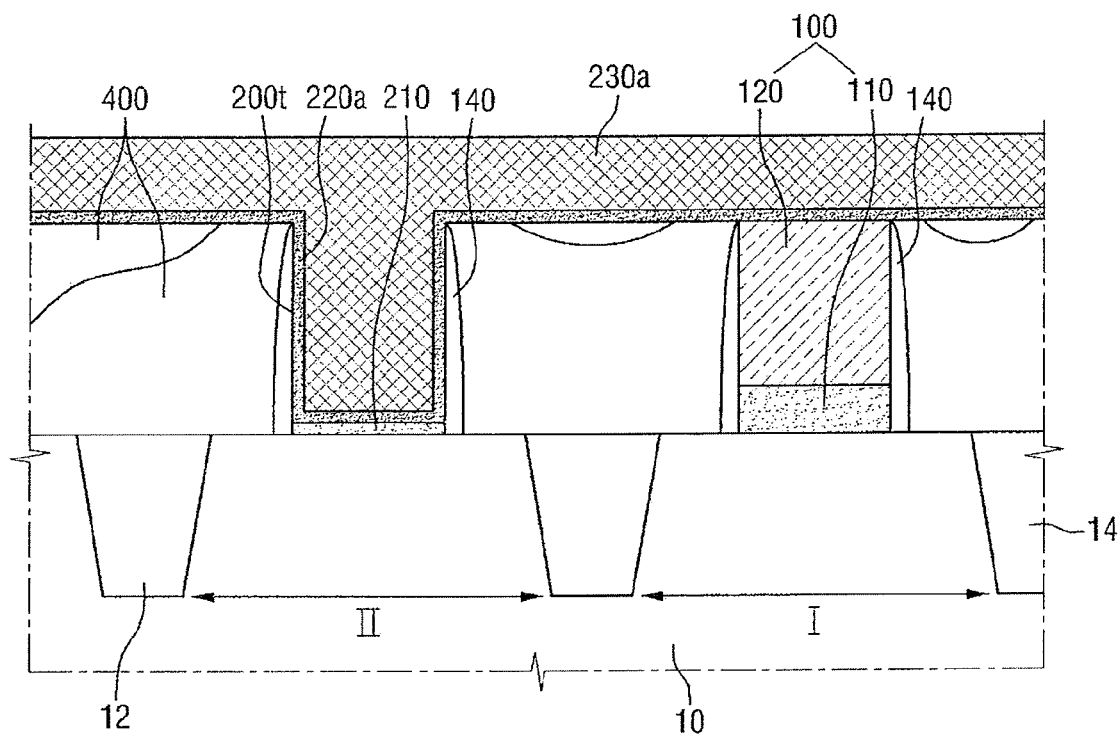

Referring to FIG. 7, the chemical silicon oxide layer 210, a high-k insulating layer 220*a* and a metal layer 230*a* are sequentially formed in the second trench 200*t*. For example, the chemical silicon oxide layer 210 is grown by a chemical method on the exposed surface of the substrate 10. The chemical silicon oxide layer 210 may be, for example, formed conformally on the bottom surface of the second trench 200*t*. The chemical silicon oxide layer 210 may serve as, e.g., an interfacial layer between the substrate 10 and the high-k insulating layer 220*a* to be formed subsequently. The high-k insulating layer 220*a* is formed on the chemical silicon oxide layer 210. The high-k insulating layer 220*a* may be formed, for example, conformally on, e.g., both side surfaces of the second trench 200*t*, and the upper surface of the chemical silicon oxide layer 210 and the upper surface of the buried insulating layer 400. The metal layer 230*a* is formed on the conformally formed high-k insulating layer 220*a*. The metal layer 230*a* is deposited to fill up the second trench 200*t*.

The chemical silicon oxide layer 210 may be formed, e.g., by processing the substrate 10 using a chemical material. For example, in the case of processing the substrate 10 using a solution including an oxygen source and ammonia ($NH_3$), a specific region of the substrate 10 may be oxidized by the oxygen source to form the chemical silicon oxide layer 210. In this case, hydrogen peroxide may be used as the oxygen source, but exemplary embodiments of the present invention are not limited thereto.

The high-k insulating layer 220*a* may include, e.g., at least one of hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, but exemplary embodiments of the present invention are not limited thereto. The high-k insulating layer 220*a* may be formed by, e.g., CVD, physical vapor deposition (PVD), or atomic layer deposition (ALD).

Although the metal layer 230*a* is illustrated as a single layer in FIG. 7, exemplary embodiments of the present invention are not limited thereto. The metal layer 230*a* may be formed of, for example, a single layer or multiple layers including, e.g., hafnium (Hf), zirconium (Zr), titanium (Ti), tantalum (Ta), aluminum (Al) and/or an alloy thereof. For example, the metal layer 230*a* may have a structure of five layers of TiN—TaN—TiAl—TiN—Ti/Al. The metal layer 230*a* may be formed by, e.g., CVD, PVD, or ALD.

Figure 8:
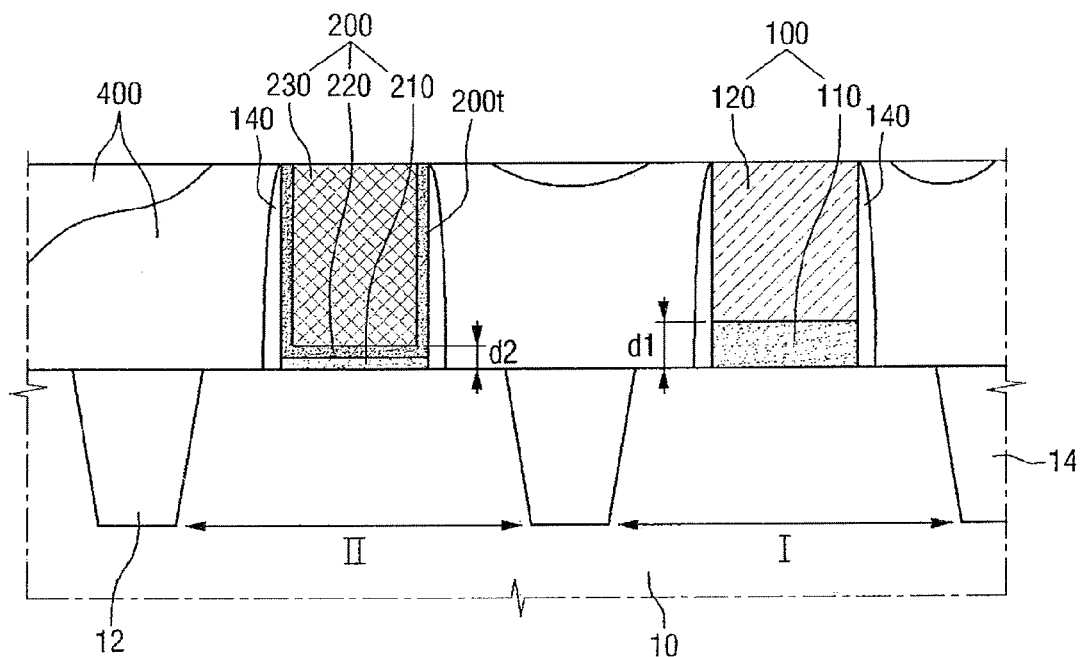

Referring to FIGS. 7 and 8, the upper surface of the first gate pattern 100, e.g., the silicon gate electrode 120 is exposed by removing a portion of the metal layer 230*a* and a portion of the high-k insulating layer 220*a*. Accordingly, the second gate pattern 200 is formed on the surface of the substrate exposed in the second trench 200*t*. The second gate pattern 200 includes, for example, the second gate insulating layer 210 and 220 and the metal gate electrode 230. The second gate insulating layer 210 and 220 includes, for example, the chemical silicon oxide layer 210 and the high-k gate insulating layer 220. In the method for fabricating a semiconductor device according to the present exemplary embodiment of the present invention, a case of removing both a portion of the metal layer 230*a* and a portion of the high-k insulating layer 220*a* has been described, but exemplary embodiments of the present invention are not limited thereto. That is, the metal gate electrode 230 may be formed, for example, after forming the high-k gate insulating layer 220 by removing a portion of the high-k insulating layer 220*a*.

The thickness d1 of the first gate insulating layer 110 included in the first gate pattern 100 is, for example, larger than the thickness d2 of the second gate insulating layer 210 and 220 included in the second gate pattern 200. However, a dielectric constant of the first gate insulating layer 110 may be, for example, smaller than a dielectric constant of the second gate insulating layer 210 and 220. The high-k gate insulating layer 220 included in the second gate insulating layer 210 and 220 may be formed, for example, conformally on both side surfaces and bottom surface of the second trench 200*t*.

Figure 9:
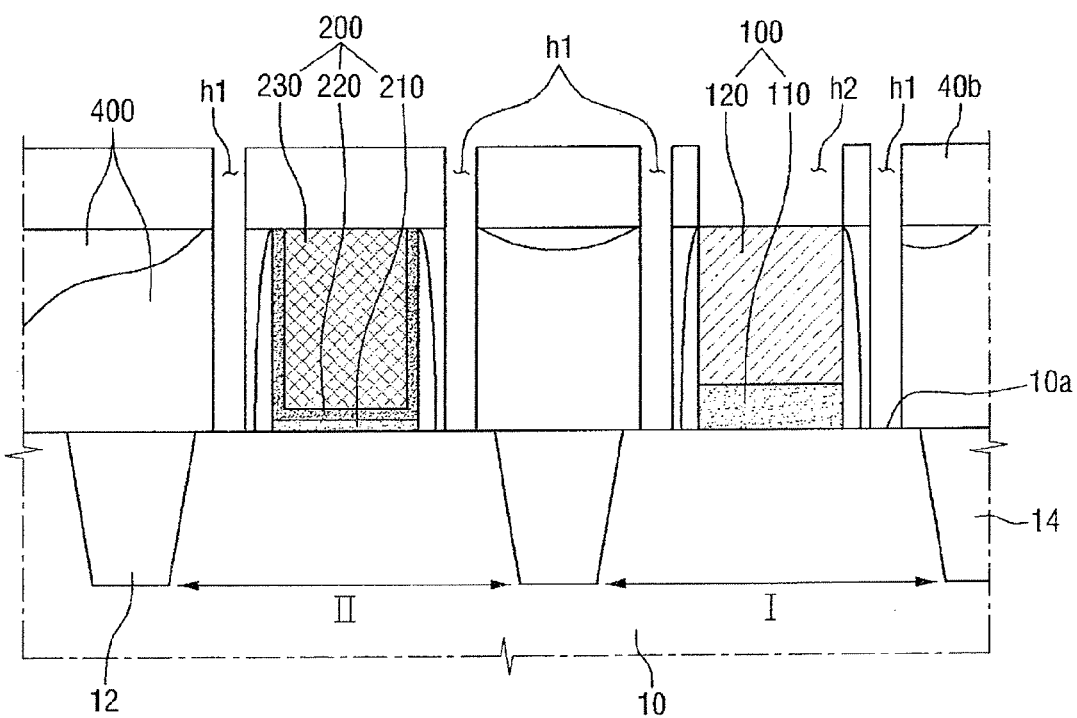

Referring to FIG. 9, a mask pattern 40*b* is formed on the first gate pattern 100, the second gate pattern 200 and the buried insulating layer 400. The mask pattern 40*b* includes, for example, first contact holes h1 and a second contact hole h2. The first contact holes h1 and the second contact hole h2 may be formed, for example, simultaneously in the mask pattern 40*b*. The first contact holes h1 are formed to, for example, pass through the mask pattern 40*b* and the buried insulating layer 400. The first contact holes h1 are formed, for example, at both sides of the first gate pattern 100 and the second gate pattern 200. The first contact holes h1 may expose, for example, a surface 10*a* of the substrate at both sides of the first gate pattern 100 and the second gate pattern 200. The second contact hole h2 may be formed, for example, on the first silicon gate electrode 120 to expose the upper surface of the first silicon gate electrode 120.

Figure 10:
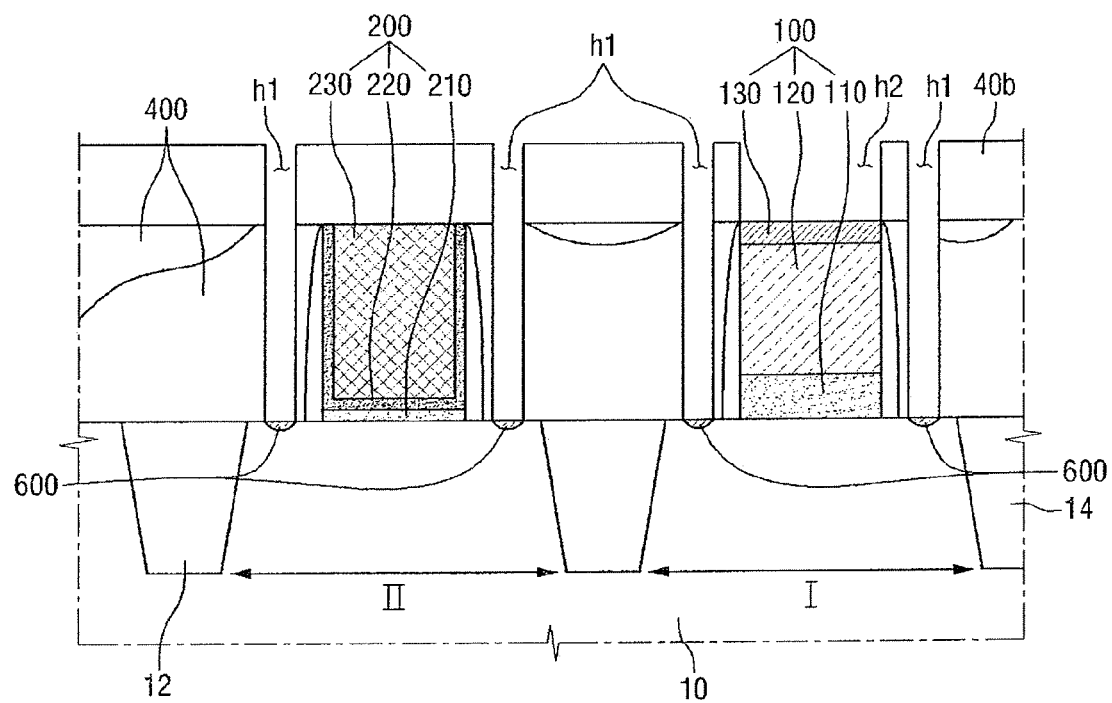

Referring to FIG. 10, a metal layer (not shown) for forming a silicide is formed on the mask pattern 40b. The metal layer is formed, for example, conformally on the upper surface of the mask pattern 40b, the silicon gate electrode 120 and the surface 10a of the substrate (see FIG. 9) exposed by the first contact holes h1 and the second contact hole h2. Then, for example, a thermal treatment may be performed to allow the silicon gate electrode 120 to react with the surface 10a of the substrate 10 exposing the metal layer for forming a silicide. The first gate silicide 130 may be formed on the silicon gate electrode 120 by, for example, thermal treatment of the metal layer. If the substrate 10 is, e.g., a silicon substrate, when forming the first gate silicide 130, a silicide pattern 600 may be formed, for example, simultaneously on the exposed substrate surface. That is, the silicide pattern 600 being formed in the first contact holes h1 may be formed, for example, at the same time as the first gate silicide 130. After forming the first gate silicide 130 and the silicide pattern 600, the unreacted metal layer is removed.

The gate silicide 130 and the silicide pattern 600 may include, e.g., any one of Ni, Pt, Ti, Ru, Rh, Co, Hf, Ta, Er, Yb and W, or a combination thereof. The metal layer for forming a silicide may be deposited by, e.g., CVD, PVD, ALD or sputtering.

A method for fabricating a semiconductor device in accordance with an exemplary embodiment of the present invention will be described with reference to FIG. 11. As this embodiment is substantially the same as the above-described methods discussed in connection with FIGS. 2 to 10 except for a method for forming a mask pattern for forming a gate silicide, the same reference numerals are assigned to the same components as those of the above-described method in connection with FIGS. 2 to 10, and thus a description thereof will be simplified or omitted.

Figure 11:
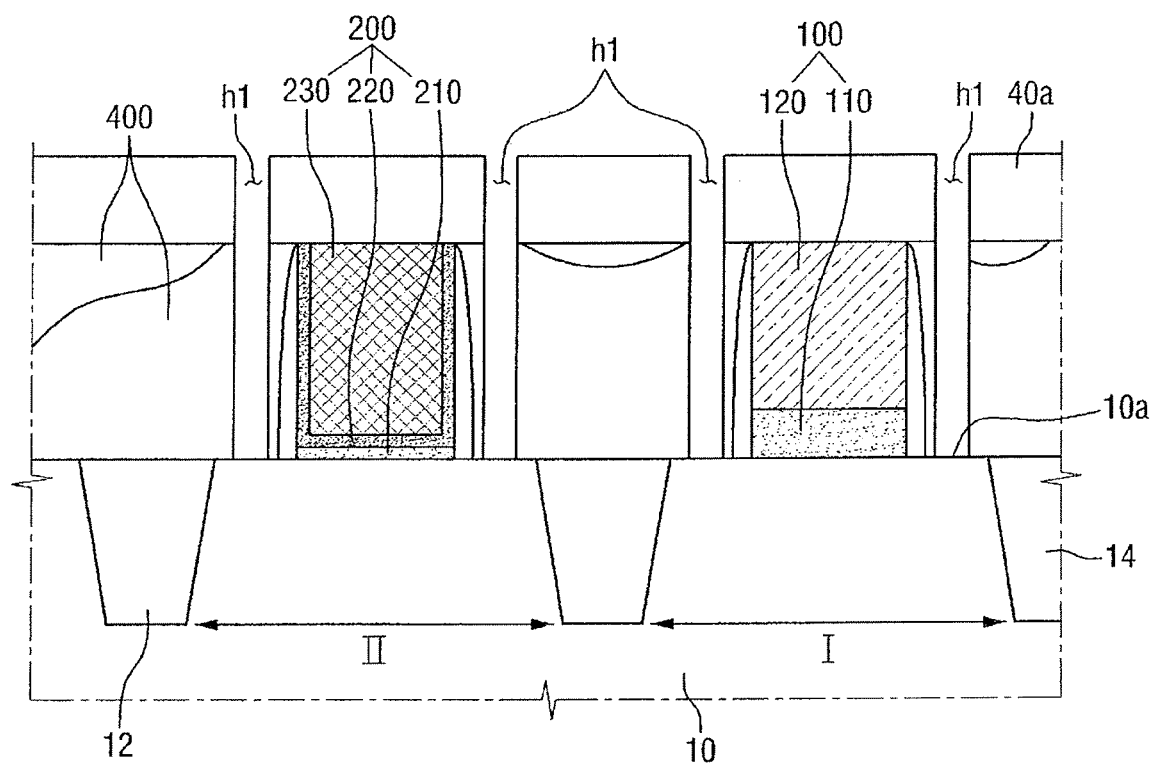
FIG. 11 illustrates an intermediate step for explaining a method for fabricating a semiconductor device in accordance with an exemplary embodiment of the present invention.

FIG. 11 illustrates an intermediate step for explaining a method for fabricating a semiconductor device in accordance with an exemplary embodiment of the present invention.

Referring to FIG. 11, a pre-mask pattern 40a is formed on the first gate pattern 100, the second gate pattern 200 and the buried insulating layer 400. The pre-mask pattern 40a includes, for example, the first contact holes h1. The first contact holes h1 are formed to, for example, pass through the pre-mask pattern 40a and the buried insulating layer 400. The first contact holes h1 are formed, for example, at both sides of the first gate pattern 100 and the second gate pattern 200. The first contact holes h1 may expose, for example, the surface 10a of the substrate 10 at both sides of the first gate pattern 100 and the second gate pattern 200.

After forming the pre-mask pattern 40a including the first contact holes h1, the second contact hole h2 is formed. Accordingly, the mask pattern 40b is formed on the first gate pattern 100, the second gate pattern 200 and the buried insulating layer 400. The second contact hole h2 may be formed on, for example, the first silicon gate electrode 120 to expose the upper surface of the first silicon gate electrode 120 in substantially the same manner as set forth in FIG. 10.

A method for fabricating a semiconductor device in accordance with an exemplary embodiment of the present invention will be described with reference to FIGS. 12 to 16. As this embodiment has the same structure as that of FIGS. 2 to 4, a redundant description thereof will be omitted by assigning the same reference numerals.

FIGS. 12 to 16 illustrate intermediate steps for explaining a method for fabricating a semiconductor device in accordance with an exemplary embodiment of the present invention.

In the present exemplary embodiment, after performing the method illustrated in FIGS. 2 to 4, then the method illustrated in FIGS. 12 to 16 may be performed.

Figure 12:
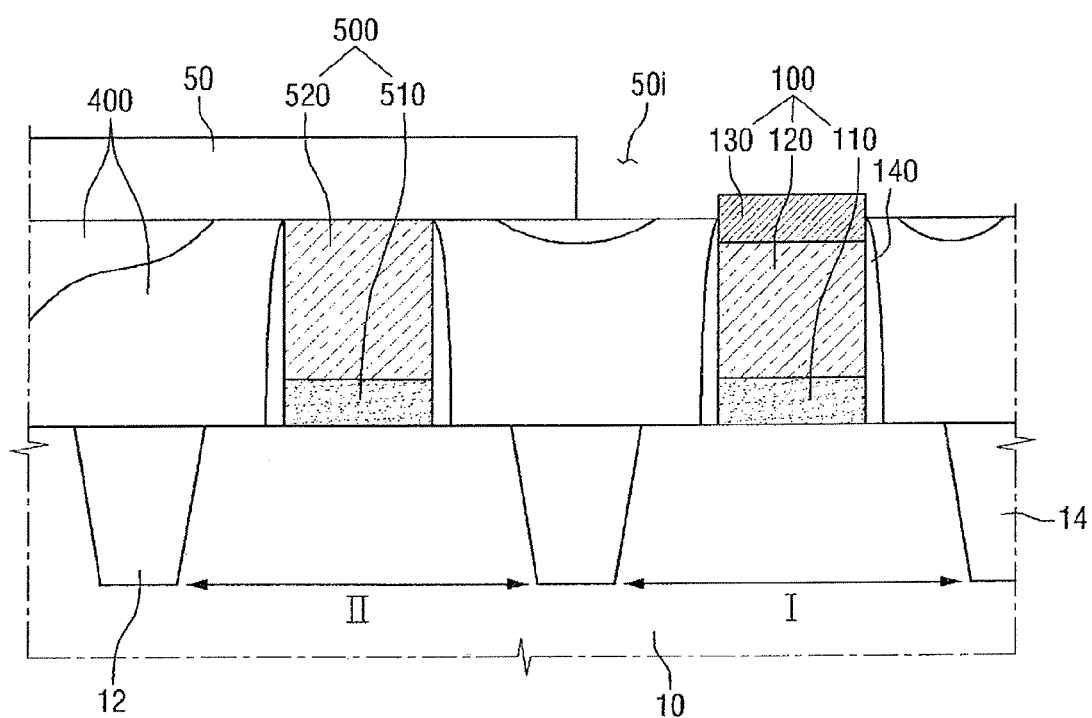
FIGS. 12 to 16 illustrate intermediate steps for explaining a method for fabricating a semiconductor device in accordance with an exemplary embodiment of the present invention.

For example, referring to FIG. 12, a blocking pattern 50 is formed on the buried insulating layer 400. The blocking pattern 50 includes, for example, a first opening 50i, and the first opening 50i is formed on the exposed first gate pattern 100. For example, the blocking pattern 50 covers the second active area II and exposes the first active area I. The first opening 50i exposes, for example, a portion of the upper surface of the buried insulating layer 400 and the upper surface of the first gate pattern 100, e.g., the first silicon gate electrode 120. The blocking pattern 50 may be, e.g., a mask pattern to be used in the subsequent step for forming a silicide.

After forming the blocking pattern 50, the first gate silicide 130 is formed on the first silicon gate electrode 120. For example, a metal layer (not shown) is formed on the blocking pattern 50 and the first gate pattern 100. Then, the first gate silicide 130 is formed on the first silicon gate electrode 120 by performing, for example, a thermal treatment on the metal layer. The first gate silicide 130 and the dummy gate pattern 500 are exposed by, for example, removing the unreacted metal layer and the blocking pattern 50. Although a case where the first gate silicide 130 protrudes from the upper surface of the buried insulating layer 400 has been illustrated in FIG. 12, exemplary embodiments of the present invention are not limited thereto.

Figure 13:
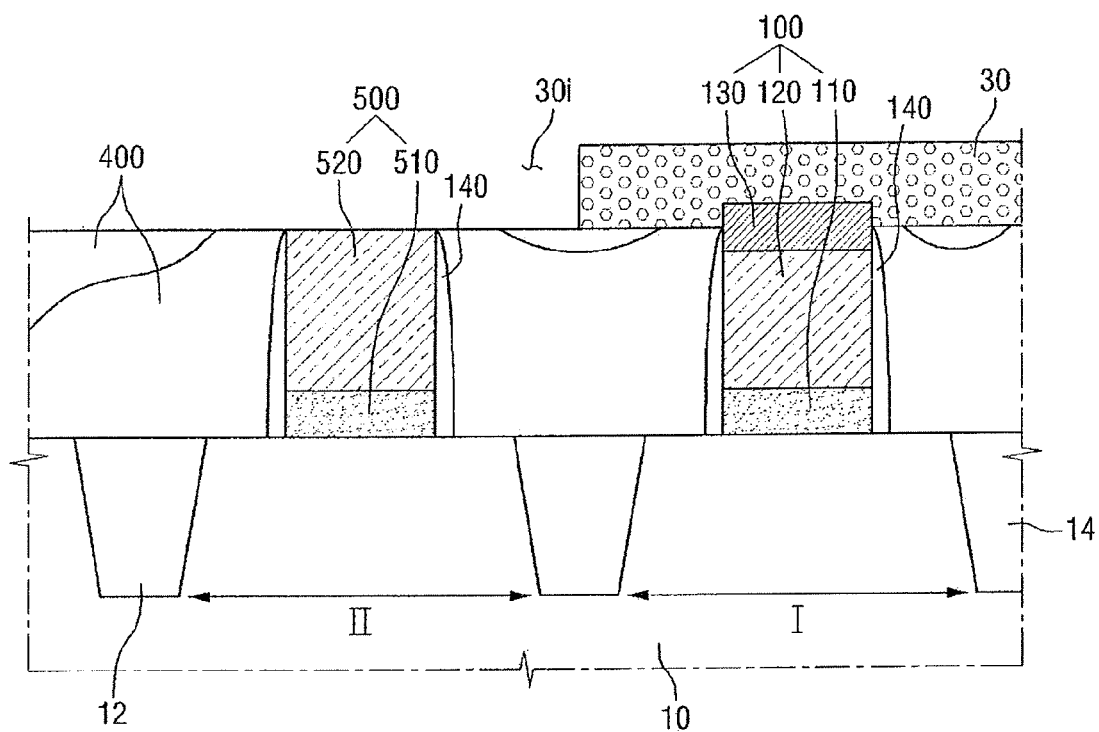

Referring to FIG. 13, the photosensitive film pattern 30 is formed on the buried insulating layer 400 and the gate silicide 130. The photosensitive film pattern 30 includes, for example, a second opening 30i and the second opening 30i is formed on the exposed dummy gate pattern 500. For example, the photosensitive film pattern 30 may protect the first active area I and expose the second active area II. The photosensitive film pattern 30 may be, e.g., a mask pattern to be used in the subsequent etching step.

Figure 14:
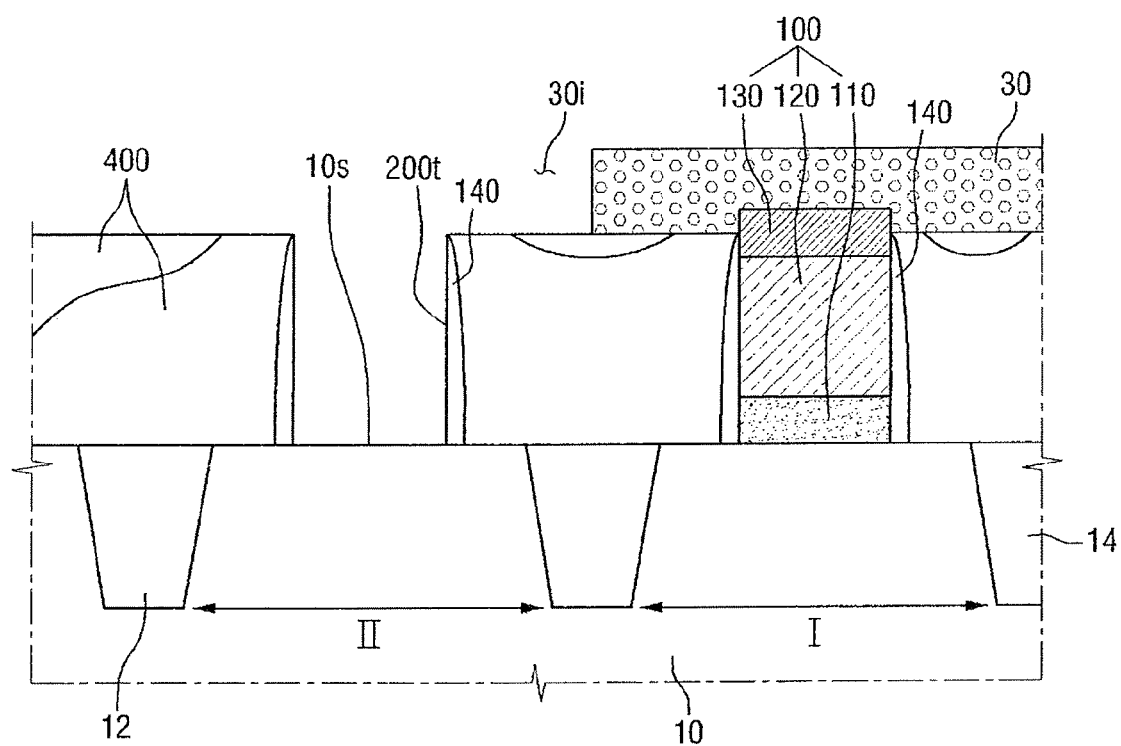

Referring to FIG. 14, the dummy gate pattern 500 is removed by, for example, using the photosensitive film pattern 30 as an etching mask to form the second trench 200t in the buried insulating layer 400. When the second trench 200t is formed in the buried insulating layer 400, the surface 10s of the substrate 10 of the second active area II may be exposed. Both side surfaces of the second trench 200t may be formed by the spacers 140. The dummy gate pattern 500 exposed by the second opening 30i is removed by, for example, an etching process. After removing the dummy gate pattern 500, the photosensitive film pattern 30 is removed.

Figure 15:
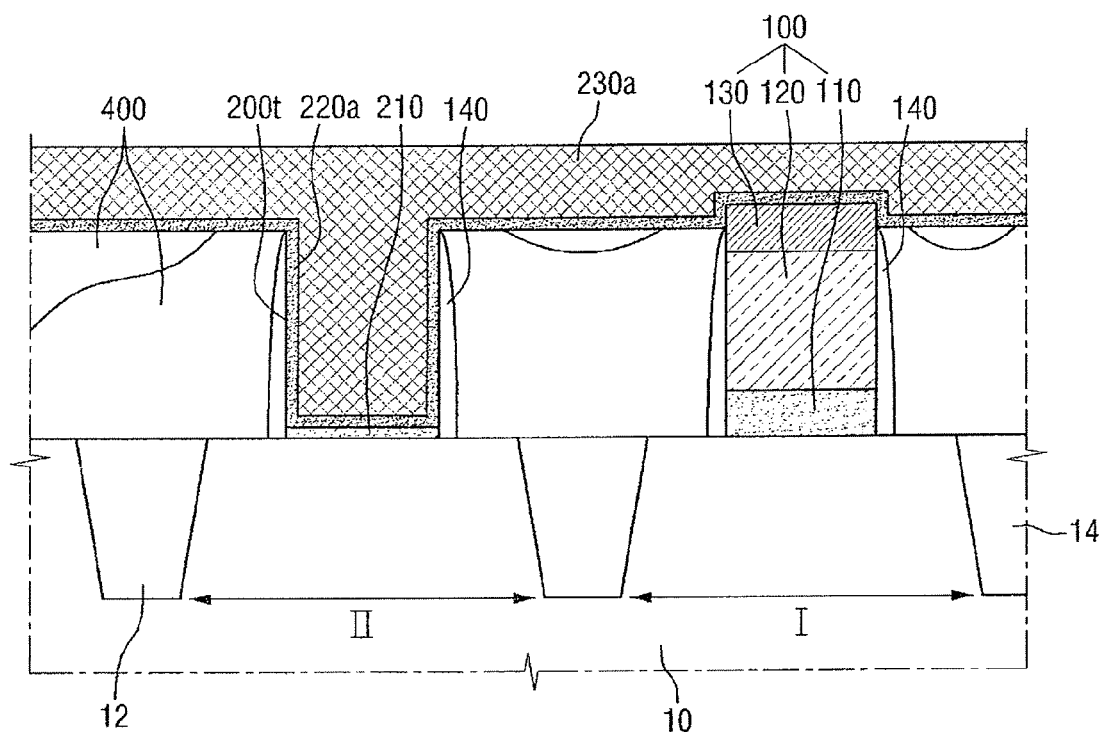

Referring to FIG. 15, the chemical silicon oxide layer 210, the high-k insulating layer 220a and the metal layer 230a are sequentially formed in the second trench 200t. For example, the chemical silicon oxide layer 210 is grown conformally by a chemical method on the exposed surface of the substrate 10. The chemical silicon oxide layer 210 may serve as, e.g., an interfacial layer between the substrate 10 and the high-k gate insulating layer 220a. The high-k insulating layer 220a is formed on the chemical silicon oxide layer 210. The high-k insulating layer 220a may be formed, for example, conformally on, e.g., both side surfaces of the second trench 200t, and the chemical silicon oxide layer 210 and the first gate silicide 130. The metal layer 230a covers the high-k insulating layer 220a and the first gate silicide 130. The metal layer 230a is deposited to fill up the second trench 200t.

Figure 16:
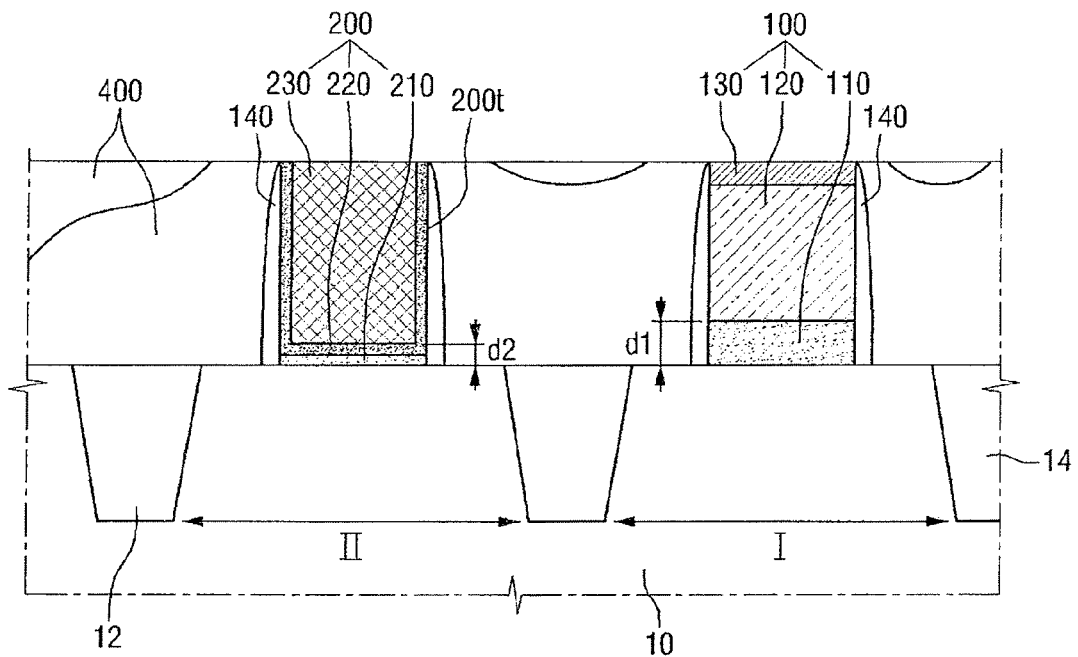

Referring to FIGS. 15 and 16, the first gate silicide 130 is exposed by, for example, removing a portion of the metal layer 230a and a portion of the high-k insulating layer 220a. Accordingly, the second gate insulating layer 210 and 220 and the metal gate electrode 230 are formed on the surface of the substrate 10 exposed in the second trench 200t. The second gate insulating layer 210 and 220 includes, for example, the chemical silicon oxide layer 210 and the high-k gate insulating layer 220. The thickness d1 of the first gate insulating layer 110 included in the first gate pattern 100 is, for example, larger than the thickness d2 of the second gate insulating layer 210 and 220 included in the second gate pattern 200.

A method for fabricating a semiconductor device in accordance with an exemplary embodiment of the present invention will be described with reference to FIGS. 17 and 18. As this exemplary embodiment is substantially the same as the method of FIGS. 12 to 16 except for the formation of a dummy silicide, the same reference numerals are assigned to the same components as those of the above-described method of FIGS. 12 to 16, and thus a description thereof will be simplified or omitted.

Figure 17:
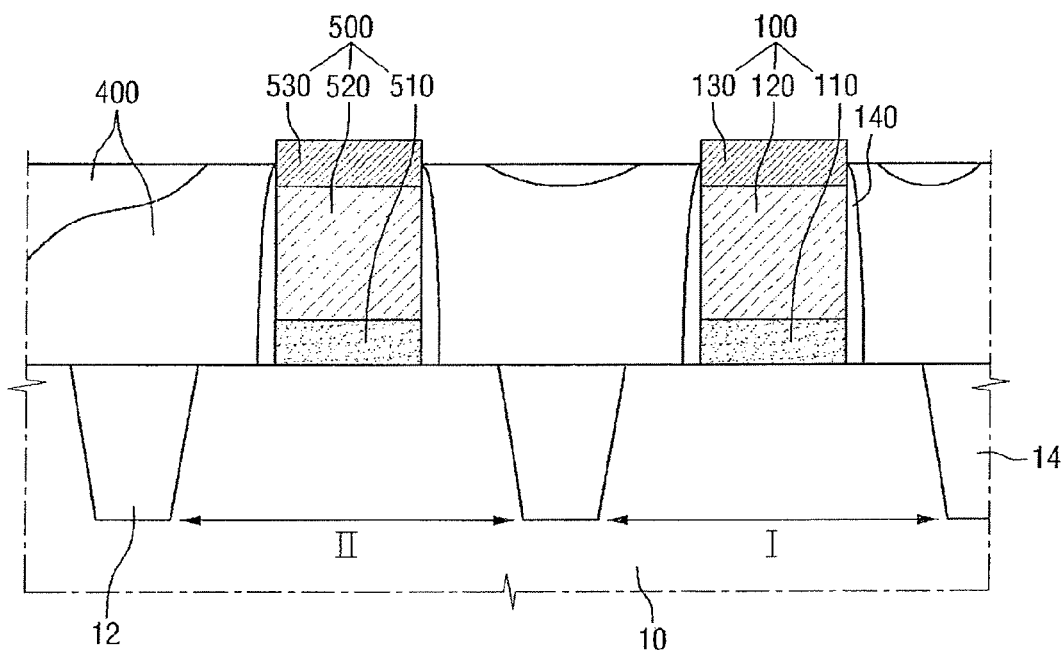
FIGS. 17 and 18 illustrate intermediate steps for explaining a method for fabricating a semiconductor device in accordance with an exemplary embodiment of the present invention.
Figure 18:
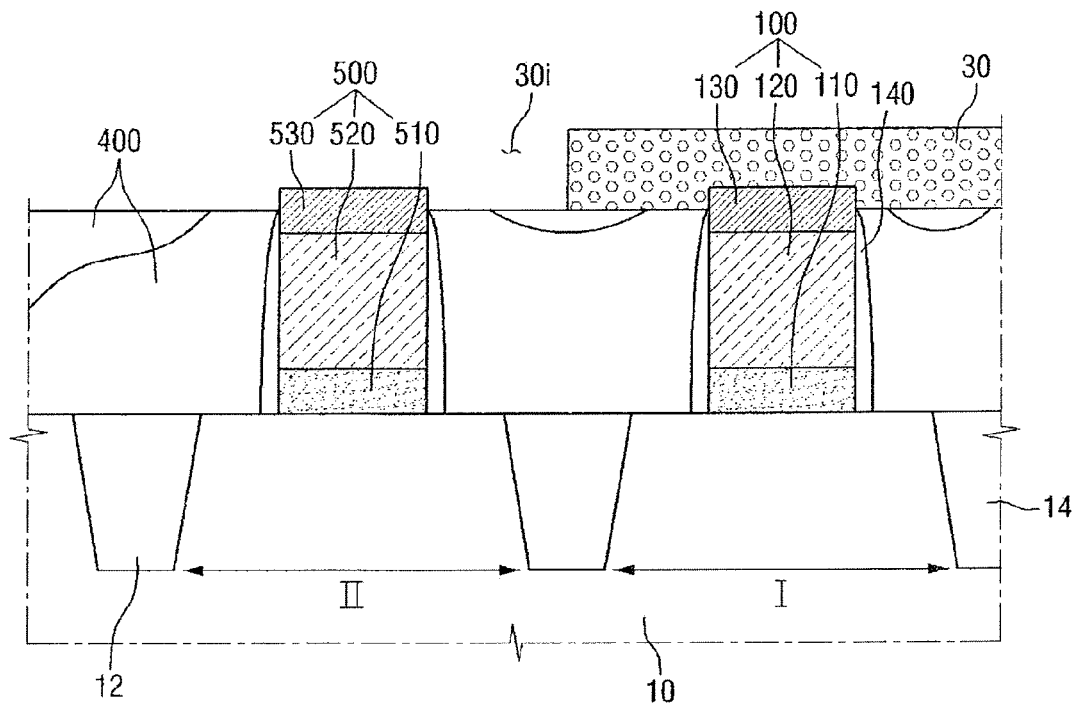

FIGS. 17 and 18 illustrate intermediate steps for explaining a method for fabricating a semiconductor device in accordance with an exemplary embodiment of the present invention.

Referring to FIG. 17, the dummy gate pattern 500 includes, for example, the dummy gate insulating layer 510 and the dummy silicon electrode 520 that are sequentially formed. After planarizing the buried insulating layer 400, when the first gate silicide 130 is formed on the first silicon gate electrode 120, a dummy silicide 530 is formed, for example, simultaneously on the dummy silicon electrode 520.

Referring to FIG. 18, the photosensitive film pattern 30 is formed on the buried insulating layer 400 and the first gate silicide 130. The photosensitive film pattern includes, for example, the opening 30i exposing the dummy silicide 530. The dummy gate pattern 500 including the dummy silicide 530 is removed by, for example, using the photosensitive film pattern 30 as a mask pattern of the etching process. As the formation of the second gate pattern 200 in the second trench 200t formed by removing the dummy gate pattern 500 is the same as described above in connection with FIGS. 14 to 16, a description thereof will be omitted.

Figure 19:
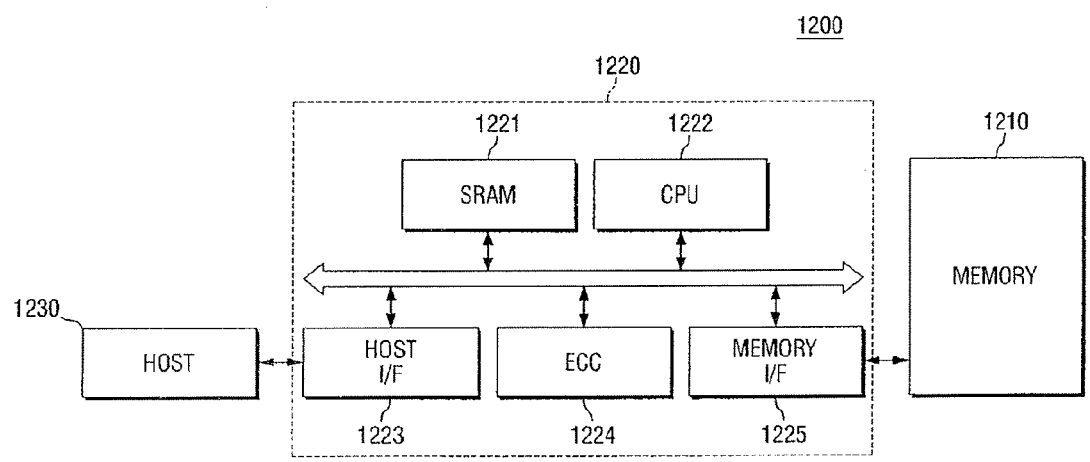
FIG. 19 is a block diagram of a memory card including a semiconductor device in accordance with an exemplary embodiment of the present invention.

FIG. 19 is a block diagram of a memory card including a semiconductor device in accordance with an exemplary embodiment of the present invention.

Referring to FIG. 19, a memory 1210 including a semiconductor device fabricated in accordance with exemplary embodiments of the present invention may be employed in a memory card 1200. The memory card 1200 may include, for example, a memory controller 1220 for controlling data exchange between a host 1230 and the memory 1210. An SRAM 1221 may be used as an operation memory of a central processing unit (CPU) 1222. A host interface (I/F) 1223 may include, for example, a protocol allowing the host 1230 to be connected with the memory card 1200 for data exchange. An error correction code (ECC) 1224 may detect and correct an error of data read from the memory 1210. A memory interface (I/F) 1225 may interface with the memory 1210. The CPU 1222 may perform a whole control operation associated with data exchange of the memory controller 1220.

Figure 20:
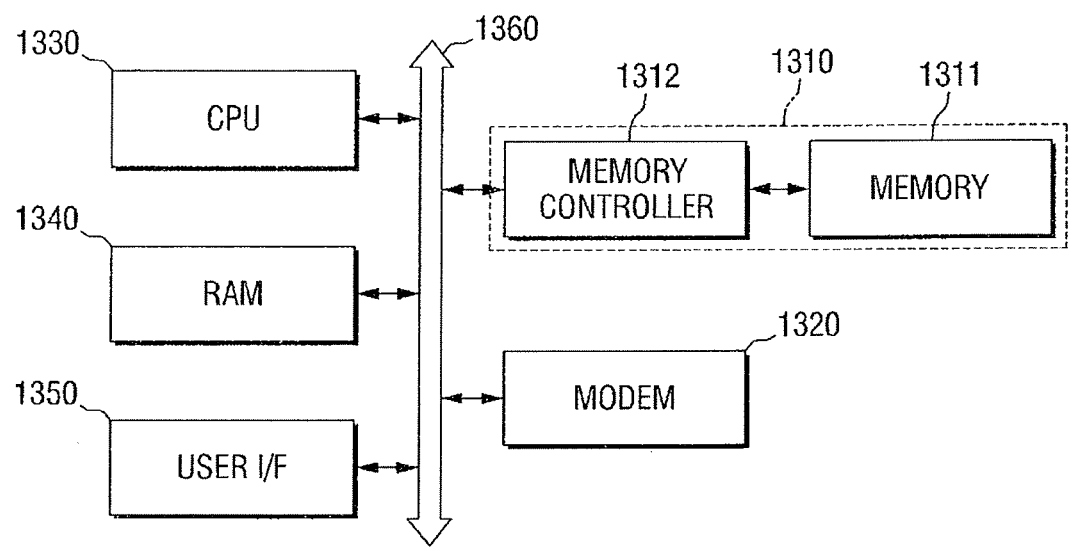
FIG. 20 is a block diagram of an information processing system using a semiconductor device in accordance with an exemplary embodiment of the present invention.

FIG. 20 is a block diagram of an information processing system using a semiconductor device in accordance with an exemplary embodiment of the present invention.

Referring to FIG. 20, an information processing system 1300 may include, for example, a memory system 1310 including a semiconductor device fabricated in accordance with exemplary embodiments of the present invention. The information processing system 1300 may include, for example, the memory system 1310, a modem 1320, a central processing unit (CPU) 1330, a RAM 1340 and a user interface (I/F) 1350, which are electrically connected to a system bus 1360. The memory system 1310 may include, for example, a memory 1311 and a memory controller 1312, and may have substantially the same configuration as that of the memory card 1200 shown in FIG. 19. The data being processed by the CPU 1330 or the data being received from an external apparatus may be stored in the memory system 1310. The information processing system 1300 may be applied to, for example, a memory card, solid state disk (SSD), camera image sensor and other various chipsets. For example, the memory system 1310 may be configured to employ a solid state disk (SSD) such that the information processing system 1300 can stably and reliably process large-capacity data.

Figure 21:
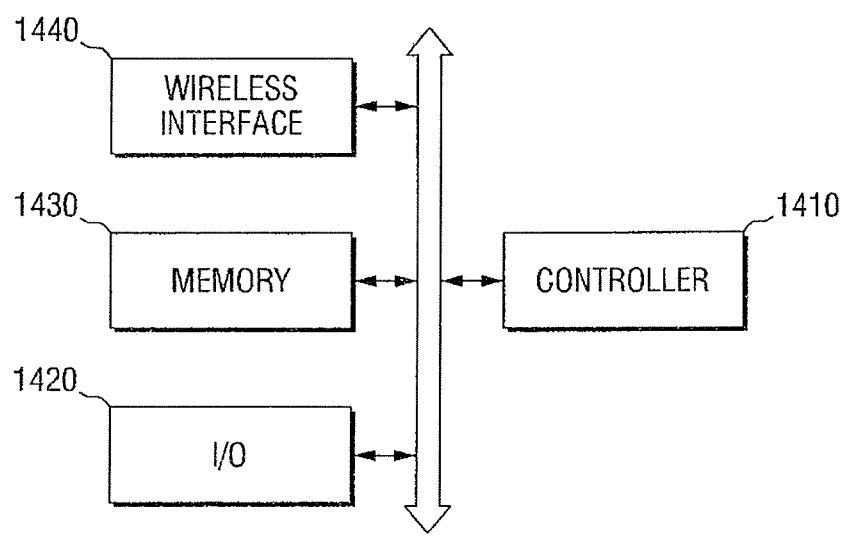
FIG. 21 is a block diagram of an electronic apparatus using a semiconductor device in accordance with an exemplary embodiment of the present invention.

FIG. 21 is a block diagram of an electronic apparatus using the semiconductor device in accordance with an exemplary embodiment of the present invention.

Referring to FIG. 21, an electronic apparatus 1400 may include, for example, a semiconductor device fabricated in accordance with exemplary embodiments of the present invention. The electronic apparatus 1400 may be used in, for example, a wireless communication apparatus (e.g., PDA, laptop computer, mobile computer, web tablet, wireless phone, and/or wireless digital music player) or in various apparatuses that can transmit and receive information in a wireless communication environment.

The electronic apparatus 1400 may include, for example, a controller 1410, an input/output unit (I/O) 1420, a memory 1430, and a wireless interface 1440. In this case, the memory 1430 may include, for a semiconductor device fabricated in accordance with exemplary embodiments of the present invention. The controller 1410 may include, for example, a processor such as a microprocessor and digital signal processor. The memory 1430 may be used to store a command (or user data) to be processed by the controller 1410. The wireless interface 1440 may be used to transmit/receive data through a wireless data network. The wireless interface 1440 may include, for example, an antenna and/or wireless transceiver. The electronic apparatus 1400 may use, for example, a protocol of a third generation communication system such as code division multiple access (CDMA) communication system, global system for mobile communication (GSM), North American dual mode cellular (NADC), Evolutionary-TDMA Scheduling Protocol (E-TDMA), wideband code division multiple access (WCDMA), and code division multiple access 2000 (CDMA2000).

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. A method for fabricating a semiconductor device, comprising:
    forming a first gate pattern and a dummy gate pattern on a first active area and a second active area of a substrate, respectively, wherein the first gate pattern includes a first gate insulating layer and a silicon gate electrode;
    removing the dummy gate pattern to expose a surface of the substrate in the second active area;
    forming a second gate pattern including a second gate insulating layer and a metal gate electrode on the exposed surface of the substrate, wherein the first gate insulating layer has a thickness larger than a thickness of the second gate insulating layer; and
    forming a gate silicide on the silicon gate electrode after forming the second gate pattern, wherein the forming of the gate silicide comprises forming a mask pattern including a plurality of first contact holes and a second contact hole on the first gate pattern and the second gate pattern, and wherein the first contact holes are formed at opposing sides of the first gate pattern and the second gate pattern, and wherein the second contact hole is formed on the silicon gate electrode.

2. The method of claim 1, wherein the removing of the dummy gate pattern comprises:

forming a buried insulating layer to surround the first gate pattern and the dummy gate pattern and expose the first gate pattern and the dummy gate pattern; and forming a trench in the buried insulating layer by etching the exposed dummy gate pattern.

3. The method of claim 2, wherein after forming the buried insulating layer, the method further comprising:

forming a mask pattern including an opening on the buried insulating layer, wherein the opening being formed on the exposed dummy gate pattern; and forming the trench in the buried insulating layer to expose the surface of the substrate by etching using the mask pattern as an etching mask.

4. The method of claim 2, wherein the forming of the second gate pattern comprises:

forming a high dielectric constant (high-k) insulating layer on a bottom surface and on opposing side surfaces of the trench;

forming a metal layer to cover the high-k insulating layer and the first gate pattern; and forming the second gate insulating layer and the metal gate electrode in the trench by removing a portion of the metal layer and the high-k insulating layer to expose an upper surface of the first gate pattern.

5. The method of claim 1, wherein the first contact holes and the second contact hole are formed simultaneously.

6. The method of claim 1, wherein the substrate is a silicon substrate, and wherein a silicide pattern is formed in the first contact holes simultaneously with the gate silicide.

7. The method of claim 1, wherein the forming of the first gate pattern and the dummy gate pattern comprises:

sequentially forming an insulating layer and a silicon layer on the substrate;

forming a mask pattern including a plurality of openings on the silicon layer, wherein the openings are formed on the first and second active areas respectively; and patterning the insulating layer and the silicon layer by etching using the mask pattern as an etching mask.

8. The method of claim 7, wherein before forming the mask pattern, the method further comprising:

implanting impurities into the silicon layer by ion implantation.

9. The method of claim 7, wherein between forming the first gate pattern and removing the dummy gate pattern, the method further comprising:

implanting impurities into the silicon gate electrode by ion implantation.

* * * * *